US006950484B1

(12) United States Patent
Jordan et al.

(10) Patent No.: US 6,950,484 B1
(45) Date of Patent: Sep. 27, 2005

(54) LINEARIZED DIGITAL PHASE-LOCKED LOOP METHOD

(75) Inventors: Timothy D. Jordan, Austin, TX (US); Terry D. Little, Austin, TX (US); Kamal Dalmia, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 691 days.

(21) Appl. No.: 09/747,188

(22) Filed: Dec. 22, 2000

Related U.S. Application Data

(60) Provisional application No. 60/203,610, filed on May 12, 2000.

(51) Int. Cl.[7] .............................................. H04L 7/00
(52) U.S. Cl. ....................................... 375/355; 327/24
(58) Field of Search ................................ 375/293, 294, 375/327, 354, 355, 360, 362, 373, 372, 340, 375/226, 252, 371, 376; 331/1 A, 179; 327/150, 327/158, 308, 2, 15, 18, 28, 30, 40; 324/24

(56) References Cited

U.S. PATENT DOCUMENTS

| | | | | |
|---|---|---|---|---|
| 4,151,485 A | 4/1979 | LaFratta | ..................... | 331/1 A |
| 4,330,759 A | 5/1982 | Anderson | ..................... | 331/14 |
| 4,523,301 A | 6/1985 | Kadota et al. | ................ | 365/49 |
| 4,672,447 A | 6/1987 | Moring et al. | ............. | 358/148 |
| 4,862,411 A * | 8/1989 | Dishon et al. | .............. | 711/167 |
| 5,059,924 A | 10/1991 | JenningsCheck | ............ | 331/1 A |
| 5,343,439 A | 8/1994 | Hoshino | ..................... | 365/240 |
| 5,493,243 A * | 2/1996 | Ghoshal | ..................... | 327/158 |
| 5,568,416 A | 10/1996 | Kawana et al. | ................ | 365/49 |
| 5,671,258 A | 9/1997 | Burns et al. | ................ | 375/359 |
| 5,812,619 A | 9/1998 | Runaldue | ..................... | 375/376 |
| 5,841,823 A | 11/1998 | Tuijn | ........................... | 375/373 |
| 5,889,436 A | 3/1999 | Yeung et al. | .................. | 331/2 |
| 5,901,110 A | 5/1999 | Jang | ........................... | 365/233 |
| 6,081,561 A * | 6/2000 | Julyan et al. | ............... | 375/340 |
| 6,222,876 B1 * | 4/2001 | Hirth et al. | .................. | 375/224 |
| 6,301,188 B1 | 10/2001 | Weber et al. | ............... | 365/233 |
| 6,438,155 B1 * | 8/2002 | Beale | ......................... | 375/130 |
| 6,477,279 B2 * | 11/2002 | Go | ............................. | 382/240 |
| 6,529,457 B1 * | 3/2003 | Narumi et al. | ........... | 369/47.53 |
| 6,721,255 B1 * | 4/2004 | Gushima et al. | ......... | 369/59.12 |

OTHER PUBLICATIONS

Bertrand J. Williams et al., "Linearized Digital Phase-Locked Loop", U.S. Appl. No. 09/745,660, filed Dec. 21, 2000.

Bertrand J. Williams et al., "Linearized Digital Phase-Locked Loop Method", U.S. Appl. No. 09/747,281, filed Dec. 21, 2000.

Terry D. Little et al., "Linearized Digital Phase-Locked Loop", U.S. Appl. No. 09/747,257, filed Dec. 22, 2000.

Bertrand J. Williams et al., "Linearized Digital Phase-Locked Loop", U.S. Appl. No. 09/747,262, filed Dec. 22, 2000.

Bertrand J. Williams et al., "Linearized Digital Phase-Locked Loop Method", U.S. Appl. No. 09/746,802, filed Dec. 22, 2000.

* cited by examiner

*Primary Examiner*—Emmanuel Bayard
(74) *Attorney, Agent, or Firm*—Christopher P. Maiorana, P.C.

(57) ABSTRACT

A method for synchronizing a clock signal to a data signal, comprising the steps of (A) detecting an edge of the data signal, (B) determining whether a position of the edge is within a zone and (B) if the edge is not within the zone, adjusting the clock signal towards the position of the edge.

14 Claims, 6 Drawing Sheets

LINEARIZED DIGITAL PHASE-LOCKED LOOP METHOD

This application claims the benefit of U.S. Provisional Application No. 60/203,610, filed May 12, 2000 and is hereby incorporated by reference in its entirety.

CROSS REFERENCE TO RELATED APPLICATIONS

The present application may relate to co-pending application Ser. No. 09/745,660, filed Dec. 21, 2000, Ser. No. 09/747,281, filed Dec. 21, 2000, Ser. No. 60/203,677, filed Dec. 22, 2000, Ser. No. 09/747,262, filed Dec. 22, 2000, and Ser. No. 09/746,802, filed Dec. 22, 2000, which are each hereby incorporated by reference in their entirety.

FIELD OF THE INVENTION

The present invention relates to a method and/or architecture for implementing phase-locked loops (PLLs) generally and, more particularly, to a method and/or architecture for implementing linearized digital PLLS.

BACKGROUND OF THE INVENTION

Conventional approaches for implementing PLLs include the bang-bang approach which comprises taking snapshots of the phase error with respect to edges of incoming data. The bang-bang approach corrects on every data edge based solely on the direction (polarity) of the offset. As a result, a bang-bang system is never truly "locked". In the best case, a bang-bang system is nearly locked and makes a correction at every data edge (i.e., clocks are either switched clockwise or counter clockwise depending on the polarity of the phase offset). The bang-bang approach has the disadvantage of introducing excessive jitter in the resulting recovered clock since the clock is being shrunk or expanded at every edge.

Referring to FIG. 1, a circuit 10 implementing a conventional bang-bang approach for constructing digital phase locked loops is shown. The circuit 10 involves the use of over sampling methods to determine in which quadrant of the clock the data edge resides. The quadrant information is then applied to an adjustment mechanism which moves the clock the appropriate direction at each interval. No information associated with the magnitude of phase error is retained or utilized. Polarity of the error and presence of a data transition are the only information used to adapt the phase of the clock to the incoming datastream.

Referring to FIG. 2, a flow diagram 30 illustrating the operation of the conventional bang-bang circuit 10 is shown. The circuit 10 checks for a data edge and determines the relative polarity between the data and clock. If the polarity of the data relative to the clock is positive, the clocks are switched counterclockwise. If the polarity of the data relative to the clock is negative, the clocks are switched clockwise.

Since the circuit 10 does not use magnitude information, a transfer function is exhibited at the phase detector which has the characteristics typical of a bang-bang approach. Such detectors have an inability to tolerate large input signal distortion, such as the distortion that may be found at the end of typical wired media.

SUMMARY OF THE INVENTION

The present invention concerns a method for synchronizing a clock signal to a data signal, comprising the steps of (A) detecting an edge of the data signal, (B) determining whether a position of the edge is within a zone and (B) if the edge is not within the zone, adjusting the clock signal towards the position of the edge.

The objects, features and advantages of the present invention include providing a method and/or architecture for implementing a linearized digital PLL that may (i) reduce the sorts of distortion associated with media induced effects, (ii) reduce duty-cycle-distortion (DCD) and/or (iii) reduce data-dependant-jitter (DDJ), (DCD and DDJ may be lumped into the single category of systematic jitter).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
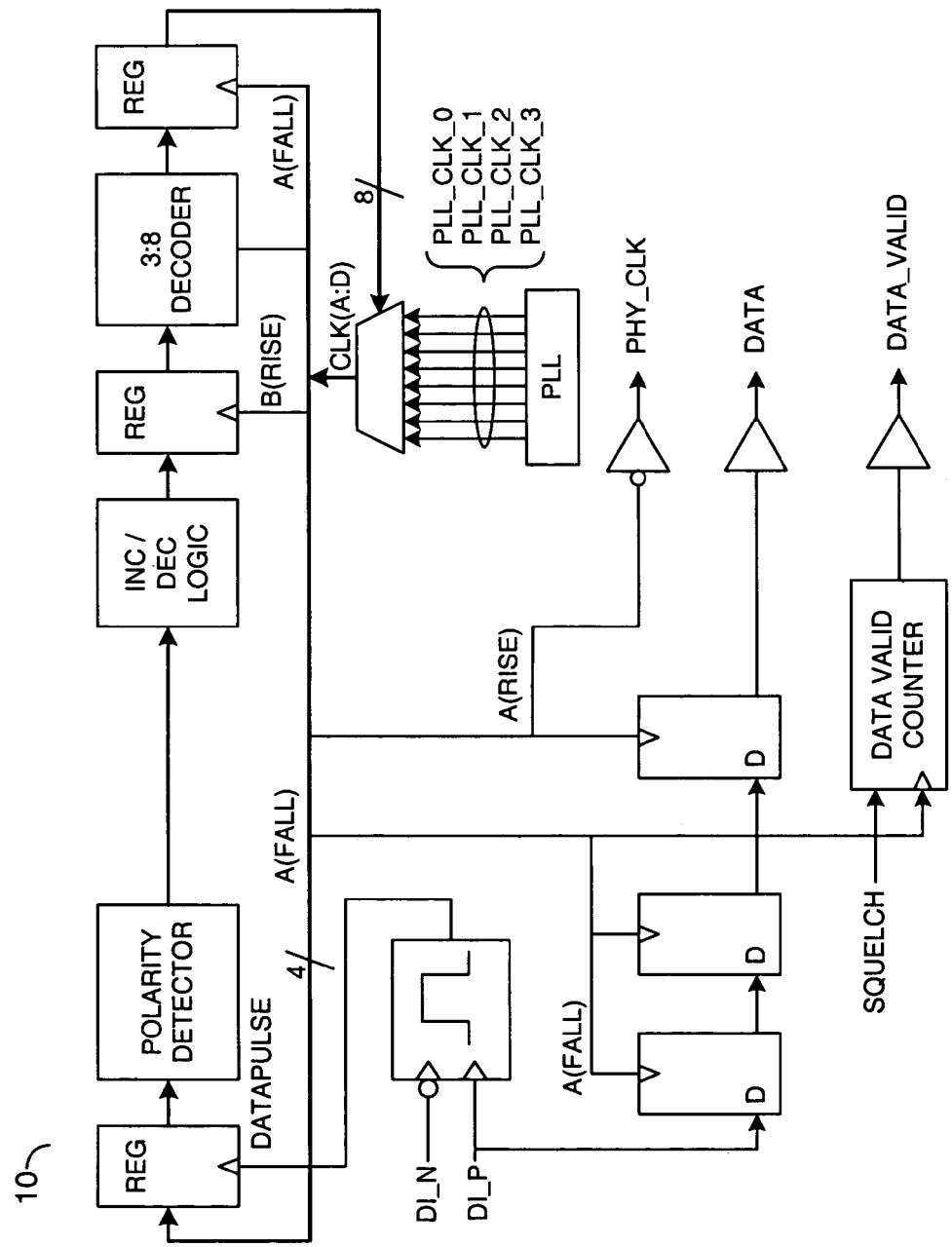
FIG. 1 is a block diagram of a conventional bang-bang system.
Figure 2:
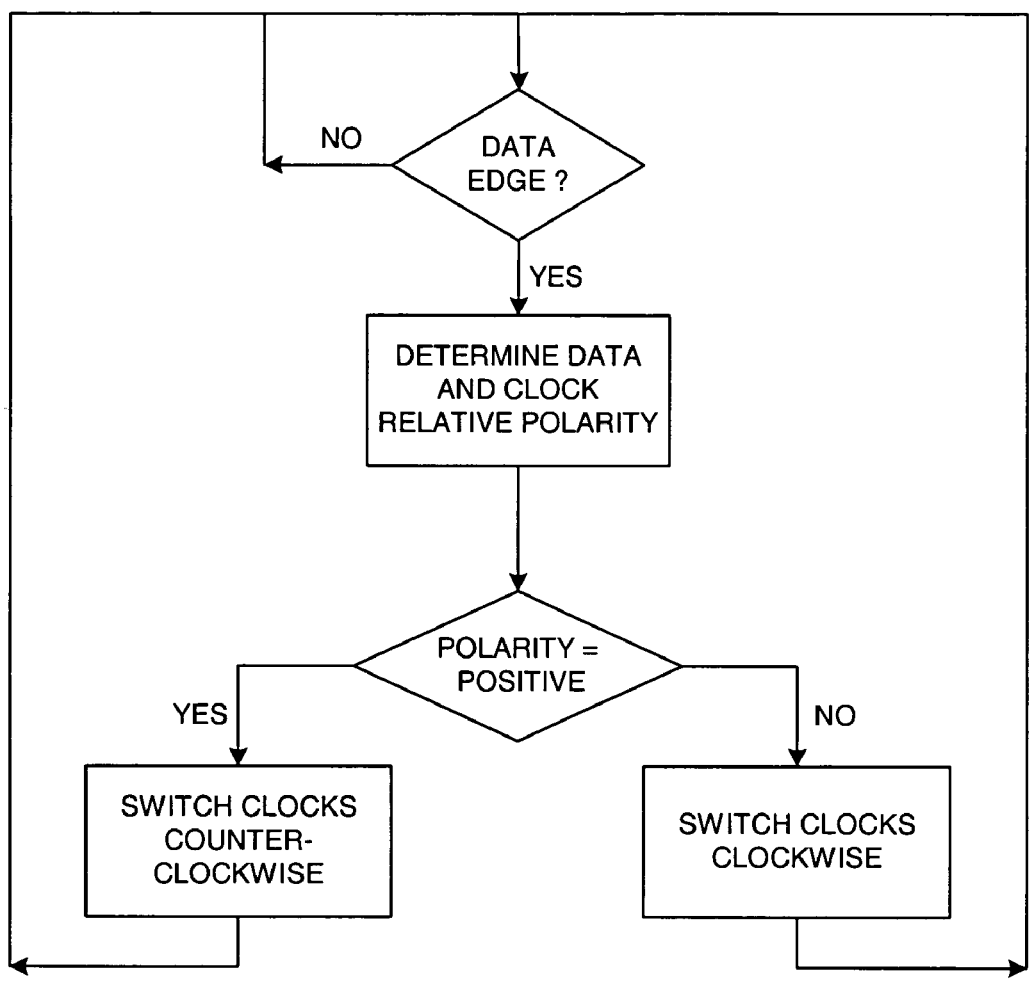
FIG. 2 is a flow diagram illustrating the operation of the conventional bang-bang circuit of FIG. 1.
Figure 3:
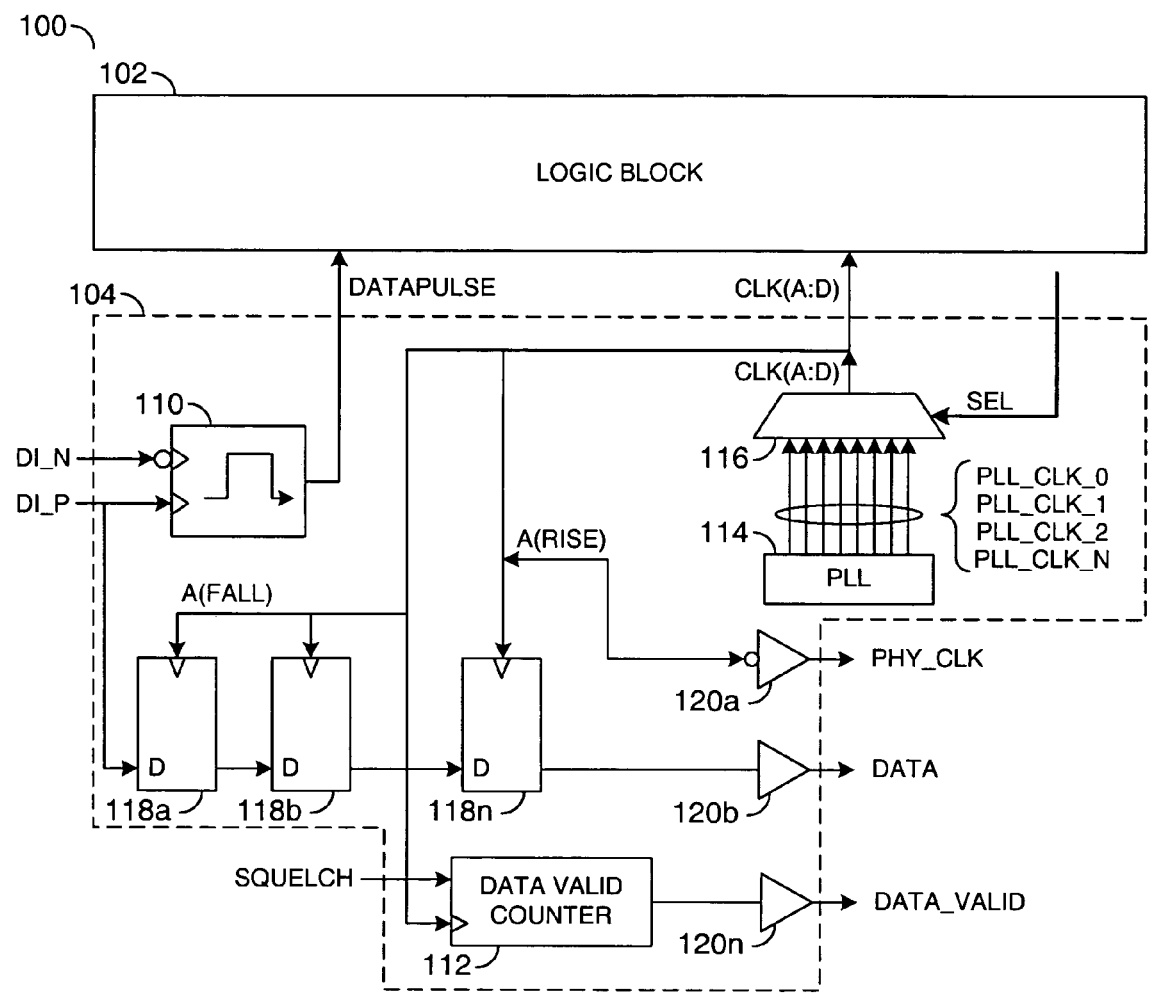
FIG. 3 is a block diagram of a preferred embodiment of the present invention.

Referring to FIG. 3, a block diagram of a circuit 100 is shown in accordance with a preferred embodiment of the present invention. The circuit 100 generally comprises a logic block (or circuit) 102 and a control block (or circuit) 104. The circuit 104 may be implemented as a control circuit configured to adjust the frequency of an output clock.

The circuit 104 generally comprises a circuit 110, a circuit 112, a circuit 114 and a circuit 116. The circuit 104 may also comprise a number of memory elements 118a–118n and a number of buffers 120a–120n. The circuit 110 may be implemented as an edge detection circuit. The circuit 110 may present a signal (e.g., DATAPULSE) to the logic block 102. The signal DATAPULSE may be generated in response to a signal (e.g., DI_N) and a signal (e.g., DI_P). The signals DI_P and DI_N may be a complementary pair of signals. In one example, the circuit 110 may be configured to generate a pulse signal in response to a transition of a data signal. The circuit 112 may be implemented as a counter circuit. The circuit 112 may present a signal (e.g., DATA_VALID). The signal DATA_VALID may be used to indicate a locked mode of the circuit 100. The circuit 114 may be implemented, in one example, as a phase lock loop (PLL). The PLL circuit 114 may present a number of clock signals (e.g., PLL_CLK_0-PLL_CLK_N) to the circuit 116. The signals PLL_CLK$_{0\_PLL}$_CLK_N may include true and complement forms of the signals.

The circuit 116 may be implemented as a multiplexer circuit. The circuit 116 may present a number of signals (e.g., CLK(A:D)). In one example, the circuit 116 may be implemented as a multiple input multiplexer that may present an output signal based on a control signal (e.g., SEL) generated by the logic block 102. The circuit 116 may be configured to select a number of the signals PLL_CLK_0-PLL_CLK_N for presentation as the signals CLK(A:D) in response to the signal SEL.

The circuit 100 may implement a digital phase-detector (e.g., the logic block 102) that may be used as an integral part of a digital phase-locked loop for data and clock recovery circuits. Specifically, the digital phase-detector 102 may be used for linearization of the phase-detection and loop mechanisms to overcome the disadvantages associated with conventional systems (discussed in the background section of the present application).

Figure 4:
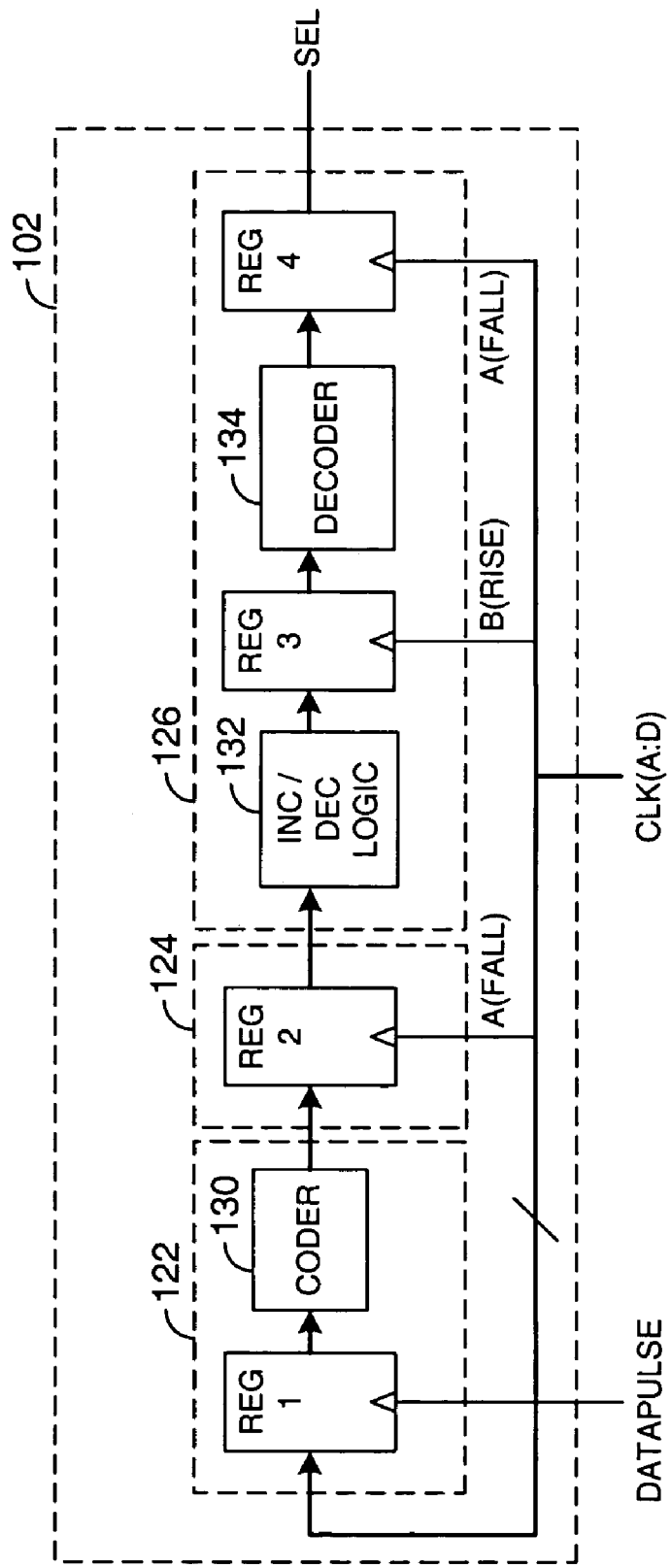
FIG. 4 is a block diagram of the logic block of FIG. 3.
Figure 5:
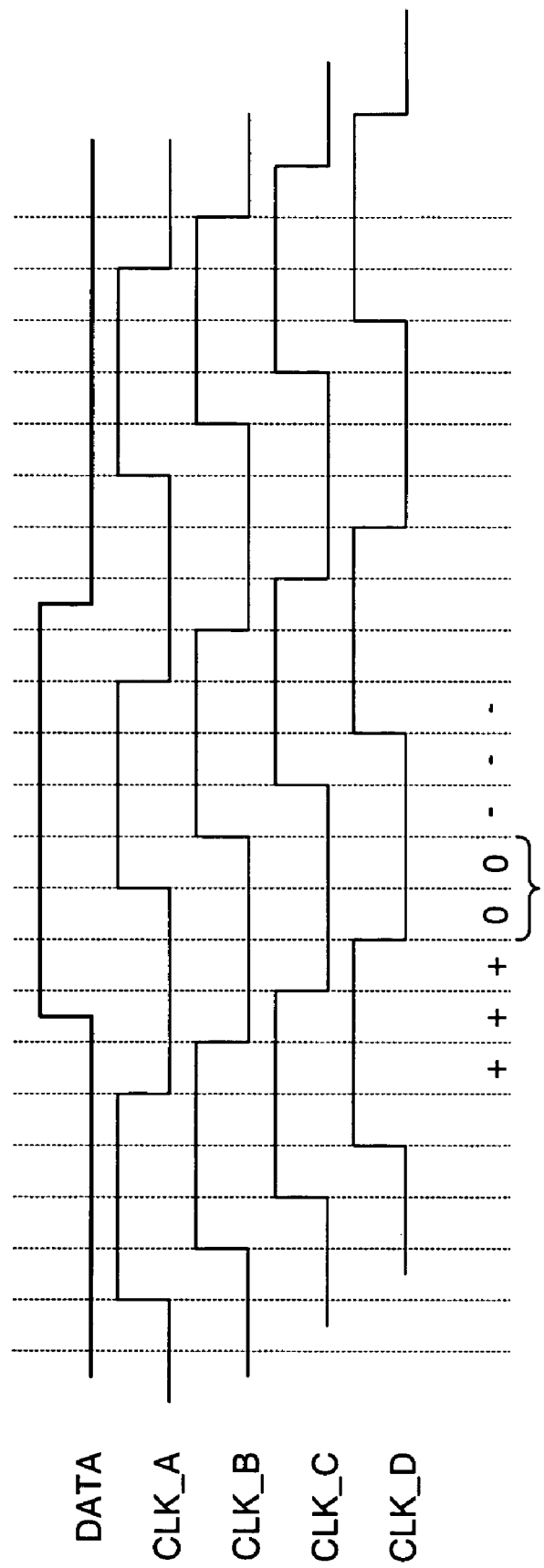
FIG. 5 is a timing diagram illustrating example waveforms of the circuit of FIG. 3.

Referring to FIG. 4, a more detailed diagram of the logic circuit 102 is shown. The logic circuit 102 generally comprises three major blocks, a phase-detector 122, a filter 124, and a phase-switcher 126. A preferred embodiment of the present invention, in its basic form, presumes a multi-phase reference clock controlled by the phase-switcher 126. The phase-detector 122 may be configured to detect the presence of a data-transition and compare the relative phase of the data-edge with that of the clock signals CLK(A:D). The relative phase is reduced to a numerical representation of the magnitude of the phase error between the data edge and the signals CLK(A:D), (e.g., between −N and +N, where N is the number of phases controlled by the phase-switcher 126).

The filter 124 may be implemented as a sample and hold circuit that maintains a relative error and generates a signal to enable the movement of the phase-switcher clock-phase and a signal to indicate the direction (e.g., increment/decrement) of such phase-movement. By combining the functions, the phase of a clock presented by the phase-switcher 126 is continually aligned to the incoming datastream allowing a simple sampling arrangement to recover the data bits. The functional architecture closely emulates an analog system, where the phase-detector and the filter block are similar, but represented by time-voltage-current analog circuits and the phase-switcher 126 is typically replaced by a VCO, or variable delay-line in a delay-locked loop (DLL). The phase detector 122 can transmit a number of discrete digital levels, where a linear system may transmit a theoretically infinite resolution of signal into the filter 124.

The filter 124 may hold digital numerical values. In a linear system, a capacitance element is utilized to integrate charge into voltage. The phase-switcher 126 combined with a multi-phase reference clock signals PLL_CLK0-PLL_CLK_N and CLK(A:D) effectively emulates VCO performance by allowing continual, though discrete-increment movement, of the clock phase edges into the system.

The phase detector 122 may comprise a register (e.g., REG1) and a circuit 130. The filter 124 may comprise a register (e.g., REG2). The phase switcher 126 may comprise a logic circuit 132, a register (e.g., REG3), a circuit 134 and a register (e.g., REG4). The circuit 130 may be implemented as a coder circuit. The circuit 132 may be implemented as an increment/decrement logic circuit. The circuit 134 may be implemented as a decoder circuit. In a preferred embodiment, the circuit 134 may be implemented as a 3 to 8 decoder.

The register REG1 generally receives the signals DATA-PULSE and CLK(A:D) from the circuit 104. An output of the register REG1 may be presented to an input of the circuit 130. The circuit 130 may have an output that may present a signal to an input of the register REG2. The circuit 130 may generate the signal by encoding the polarity and magnitude of the phase differences between the data-edge represented by the signal DATAPULSE and the signals CLK(A:D). The register REG2 may have an output that may present a signal to an input of the circuit 132. The circuit 132 may have an output that may present a signal to an input of the register REG3. The register REG3 may present a signal to an input of the circuit 134. An output of the circuit 134 may be presented to an input of the register REG4. The registers REG2 and REG4 generally have a control input that generally receives the signal CLK(A). The register REG3 generally has control input that may receive the signal CLK(B). The register REG4 generally presents the signal SEL in response to an output of the circuit 134.

The circuit 100 generally allows for the use of the detected phase error magnitude to emulate a linearized system having the characteristics at a macro level which approach a pure linear system. However, the circuit 100 may have resolution intervals allowing the simplicity of digital mechanisms to be implemented.

The advantage of the linearized system 100 over the pure digital PLL may be demonstrated by observation of the operation of the system 100 under high-levels of data stream distortion. Particularly, the operation of the circuit 100 may be observed under the sorts of distortion associated with media induced effects, (e.g., systematic jitter, duty-cycle-distortion (DCD) and data-dependant-jitter (DDJ)).

Systematic jitter has the characteristics that the predominant effect is one of having few data transitions at the average location of the data edge. Rather, the data transitions may have a bi-modal distribution of the edge placements of the datastream at some −M/+M location. When the data edges predominantly occur at locations −M and +M relative to the average location (or zero-phase) then any misalignment with the local clock cannot be determined by any single data edge placement.

The operation of the present invention may be easily demonstrated by considering a simple sequence. Presume an incoming datastream DI_N and DI_P is distorted such that the edges occur at −J nS and +K nS, where 0 nS is the ideal non-distorted location of the edges, or the 'average' location of the edges. Further presume that mechanisms associated with real systems during acquisition and normal operation are such that the magnitude of J and K are not necessarily equal. The conventional 'bang-bang' digital PLL would see −J1, +K1, −J2, +K2, −J3, +K3, etc. and generate a response, as a control to the internal phase-switcher, which would cause the clock to decrement in phase, then increment, decrement, increment, etc, no matter what the values of J and K.

The theoretical fail point for the conventional system is ½ the clock period of distortion of the incoming datastream, then reduced by addition of general system non-idealities, matching, and the presence of random jitter components in the datastream. The theoretical limits of operation of the circuit 100 are generally limited only by the numerical resolution N, associated with the detection resolution increments, and for cases of N=4, about ¾ clock-period, also as above reduced by system non-idealities, matching, and random jitter in the datastream. The ability to tolerate an additional ¼ clock-period of data distortion can make the difference between a device that is marginal or does not function with a particular media, and one that exhibits infinitely low bit-error-rates.

For the USB 2.0 specification (published April 2000 and hereby incorporated by reference in its entirety), a conventional bang-bang digital PLL will be marginal, if operable, to the system specifications for datastream distortion. Alternative implementations of the phase-detector may vary primarily in the exact construction of the numerical slicing/ detection method or conversion of phase-alignment to a numerical value or input to the accumulator. Variants of the filter block 124 are ordinarily limited to the magnitude of the accumulator threshold level detection for enabling a phase-adjustment of the phase-switcher block 126. Other filter clock variants may allow for the effective detection limit to adapt to acquisition conditions to allow for combination of fast acquisition and maximum tolerance when acquired. The implementation variants of the phase-switcher 126 and reference clock functions are predominantly associated with the number of raw clock phases available (e.g., 2N) for selection-switching, and the incrementer/decrementer and associated clock-mux design and timing.

The circuit 100 implements the clocks sampled by data method described in co-pending provisional application (Ser. No. 60/203,616), which is hereby incorporated by reference in its entirety.

A detailed description of an operation of the logic block 102 will now be described. An incoming serial data signal DI_N and DI_P may be sampled on the rising and falling edges to generate the signal DATAPULSE. The signal DATAPULSE may be used to clock the current values of the clocks CLK(A:D) into the register REG1. The value of the register REG1 may be encoded into, in one example, a 3-bit signal (via the coder 130). However, other bitwidths may be implemented to meet the design criteria of a particular application. The output of the encoder circuit 130 is a 3-bit signal, the output may comprise one bit of polarity information and two bits of magnitude information. The coded value generally represents the offset of the sampled clocks to the ideal sample point in the serial data stream. The coded value is generally clocked into the register REG2 on the falling edge of the signal CLKA (e.g., A(fall)).

A decision is then made depending on the current operation mode of the system. When the system 100 is in the high bandwidth (or acquire) mode, if the magnitude of the offset value is zero then no further action is taken (e.g., the Inc/Dec logic 136 is not enabled). However, if the magnitude of the offset is non-zero then the polarity of the offset is passed directly to the Inc/Dec logic 136, (e.g., the Inc/Dec logic 136 is enabled). The value of the register REG3 is then incremented or decremented as indicated by the polarity of the offset value on the next falling edge of the clock signal CLKA. The register REG3 and the Inc/Dec logic 136 may be implemented as a 3-bit counter with wrap around and single adjustment limits. The value of the register REG3 may be decoded into a 1 of 8 value that is clocked into the register REG4 on the next falling edge of the signal CLKA.

When the register REG4 is updated the select values into the PLL clock select multiplexer(s) 116 are changed, thus changing the mapping between the input PLL clocks (PLL_CLK$_{O-PLL}$_CLK_N) and the internally sampled clocks CLK(A–D). For example, where the input PLL clocks are all 480 MHz clocks with ⅛ bit of phase difference, the selection may result in a ⅛ bit time phase adjustment on the sample clock CLKA.

The counter 112 may assert the signal DATAVALID at a first predetermined count (e.g., seven bit times). The circuit 100 may present the output clock as the inversion of the current CLKA. The data is generally recovered by sampling the data stream with a falling edge of the signal CLKA (e.g., through two D flip-flops) and then again with a rising edge of the signal CLKA (e.g., through a third D flip-flop) to ensure that it is synchronized with the output recovered clock.

Figure 6:
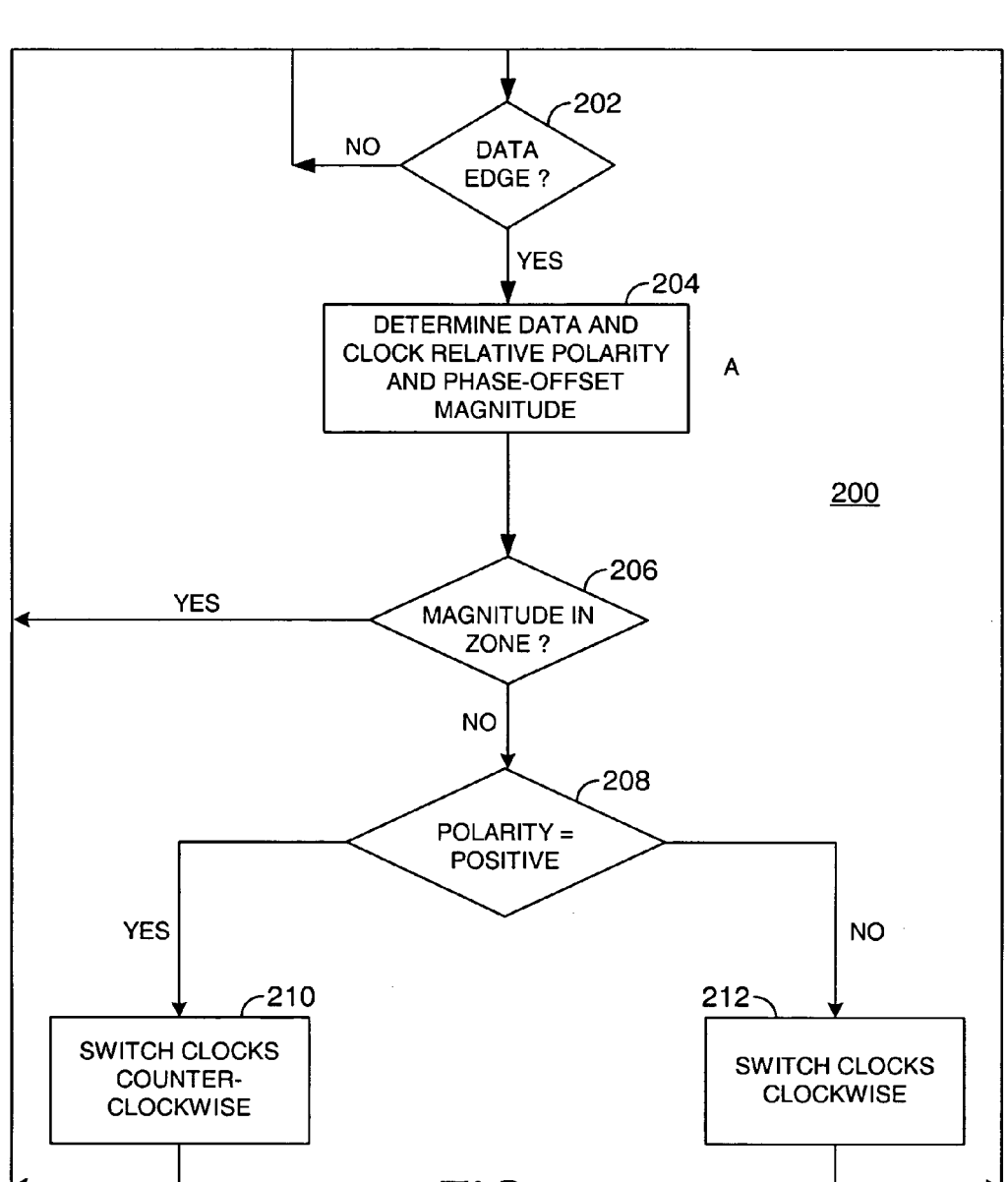
FIG. 6 is a flow diagram illustrating an example operation of the present invention.

Referring to FIG. 6, a method (or process) 200 is shown. The method 200 generally comprises a decision state 202, a state 204, a decision state 206, a decision state 208, a state 210 and a state 212. The decision state 202 generally determines if a data edge is present. If a data edge is not present, the decision state 202 continues to check for such a condition. If a data edge is present, the state 204 determines a relative polarity and phase-offset magnitude for the data and clock. The decision state 206 determines if the magnitude is within a predetermined zone. When the magnitude is within the zone, the process returns to checking for a data edge (e.g., the state 202). When the magnitude is not within the zone, the decision state 208 generally determines whether the polarity of the offset is positive or negative. If the polarity is positive, the state 210 switches the clock counter clockwise and returns to the state 202. If the polarity is negative, the state 212 switches the clocks clockwise and returns to the state 202.

The function performed by the flow diagram of FIG. 6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMS, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for synchronizing a clock signal to a data signal, comprising the steps of:
   (A) detecting an edge of said data signal;
   (B) generating a relative polarity and a magnitude of a phase error between (i) said edge of said data signal and (ii) said clock signal;
   (C) determining whether said magnitude is within a predetermined zone;
   (D) if said magnitude is within said predetermined zone, repeating steps (A)–(C);
   (E) if said magnitude is not within said predetermined zone, determining whether said relative polarity is a positive polarity or a negative polarity;
   (F) if said relative polarity is positive, incrementing an accumulated value to adjust said position of said edge; and
   (G) if said relative polarity is negative, decrementing said accumulated value to adjust said position of said edge.

2. The method of claim 1, wherein step (A) comprises the sub-step of:
   (A-1) sampling a number of clock signals using said data signal.

3. The method according to claim 2, wherein step (A) further comprises the sub-step of:
(A-2) encoding a position of said edge.

4. The method of claim 1, wherein step (B) further comprises:
comparing an encoded position of said edge to a predetermined value.

5. The method of claim 3, wherein step (A) further comprises the sub-step of:
storing said encoded position.

6. The method of claim 1, wherein step (C) further comprises the sub-step of selecting a number of clock phases based upon said accumulated value.

7. An apparatus for synchronizing a clock signal to a data signal, comprising:
a detector configured to produce a relative polarity and a magnitude representing a position of an edge of said data signal based upon a state of said clock signal; and
a control circuit configured to adjust said clock signal by determining whether said magnitude is within a predetermined zone, and if said magnitude is not within said predetermined zone, determining whether said relative polarity is a positive polarity or a negative polarity and (i) if said relative polarity is positive, incrementing an accumulated value to adjust said position of said edge, and (ii) if said relative polarity is negative, decrementing said accumulated value to adjust said position of said edge.

8. The apparatus of claim 7, wherein said control circuit further comprises a storage element configured to store an accumulated value representing an encoded position of said edge.

9. The apparatus of claim 7, wherein said control circuit further comprises an increment/decrement logic circuit configured to adjust said accumulated value in response to said relative polarity and magnitude, wherein said relative polarity and magnitude are updated each time said detector produces said relative polarity and magnitude.

10. The apparatus of claim 7, wherein said clock signal comprises a plurality of phases.

11. The apparatus of claim 10, wherein said control circuit selects one or said plurality of phases as a system clock.

12. An apparatus for synchronizing a clock signal to a data signal, comprising:
means for detecting an edge of said data signal;
means for generating a relative polarity and a magnitude of a phase error between (i) said edge of said data signal and (ii) said clock signal;
means for determining whether said magnitude is within a predetermined zone; and
means for determining whether said relative polarity is a positive polarity or a negative polarity and (i) if said relative polarity is positive, incrementing an accumulated value to adjust said position of said edge, and (ii) if said relative polarity is negative, decrementing said accumulated value to adjust said position of said edge.

13. A method for synchronizing a clock signal to a data signal, comprising the steps of:
(A) detecting an edge of a data signal;
(B) determining a relative polarity and a phase offset magnitude as a numeric representation of said edge of said data signal relative to said clock signal;
(C) if said phase offset magnitude is less than a predetermined value, repeating steps (A) and (B);
(D) if said magnitude is greater than a predetermined value, determining a polarity of said phase offset magnitude; and
(E) adjusting said clock signal (i) counter-clockwise if said polarity is positive and (ii) clockwise if said polarity is not positive.

14. The method according to claim 13, further comprising the step of:
generating an accumulated value for said numeric representation of said magnitude, wherein said accumulated value is updated each pass through step (B).

* * * * *